United States Patent
Varghese et al.

(10) Patent No.: US 11,018,138 B2
(45) Date of Patent: May 25, 2021

(54) METHODS FOR FORMING DYNAMIC RANDOM-ACCESS DEVICES BY IMPLANTING A DRAIN THROUGH A SPACER OPENING AT THE BOTTOM OF ANGLED STRUCTURES

(71) Applicant: APPLIED Materials, Inc., Santa Clara, CA (US)

(72) Inventors: Sony Varghese, Manchester, MA (US); Min Gyu Sung, Essex, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 32 days.

(21) Appl. No.: 16/664,107

(22) Filed: Oct. 25, 2019

(65) Prior Publication Data
US 2021/0125994 A1  Apr. 29, 2021

(51) Int. Cl.
*H01L 27/108* (2006.01)
*H01L 21/768* (2006.01)
*H01L 29/417* (2006.01)
*H01L 21/311* (2006.01)

(52) U.S. Cl.
CPC .. *H01L 27/10823* (2013.01); *H01L 21/31116* (2013.01); *H01L 21/76816* (2013.01); *H01L 27/10826* (2013.01); *H01L 27/10876* (2013.01); *H01L 27/10879* (2013.01); *H01L 27/10885* (2013.01); *H01L 27/10891* (2013.01); *H01L 29/41741* (2013.01); *H01L 21/76877* (2013.01)

(58) Field of Classification Search
CPC .......... H01L 27/10805–10841; H01L 27/10844–10894; H01L 27/10885; H01L 27/10891; H01L 27/10826; H01L 27/10879
See application file for complete search history.

(56) References Cited

U.S. PATENT DOCUMENTS

| | | | |
|---|---|---|---|
| 2012/0007208 A1* | 1/2012 | Kim | H01L 21/3086 257/506 |
| 2012/0007258 A1* | 1/2012 | Oh | H01L 21/743 257/776 |
| 2012/0009748 A1* | 1/2012 | Ji | H01L 27/10885 438/270 |
| 2012/0064704 A1* | 3/2012 | Kim | H01L 27/10885 438/513 |

(Continued)

*Primary Examiner* — Younes Boulghassoul
(74) *Attorney, Agent, or Firm* — Kacvinsky Daisak Bluni PLLC

(57) ABSTRACT

Disclosed are DRAM devices and methods of forming DRAM devices. One method may include forming a plurality of trenches and angled structures, each angled structure including a first sidewall opposite a second sidewall, wherein the second sidewall extends over an adjacent trench. The method may include forming a spacer along a bottom surface of the trench, along the second sidewall, and along the first sidewall, wherein the spacer has an opening at a bottom portion of the first sidewall. The method may include forming a drain in each of the angled structures by performing an ion implant, which impacts the first sidewall through the opening at the bottom portion of the first sidewall. The method may include removing the spacer from the first sidewall, forming a bitline over the spacer along the bottom surface of each of the trenches, and forming a series of wordlines along the angled structures.

15 Claims, 8 Drawing Sheets

(56) References Cited

U.S. PATENT DOCUMENTS

| | | | |
|---|---|---|---|
| 2012/0135605 A1* | 5/2012 | Kim | H01L 27/10888 438/696 |
| 2015/0311073 A1* | 10/2015 | Srinivasan | H01L 29/045 438/504 |
| 2020/0027832 A1* | 1/2020 | Varghese | H01L 21/76885 |

* cited by examiner

METHODS FOR FORMING DYNAMIC RANDOM-ACCESS DEVICES BY IMPLANTING A DRAIN THROUGH A SPACER OPENING AT THE BOTTOM OF ANGLED STRUCTURES

FIELD

The present embodiments relate to semiconductor substrates, and more particularly, to $4F^2$ dynamic random-access devices and approaches for forming.

BACKGROUND

As dynamic random-access memory (DRAM) devices scale to smaller dimensions, an increasing emphasis is placed on patterning for forming three dimensional structures, including trenches for storage nodes as well as access transistors. In current DRAM devices, transistors may be formed using narrow and tall, vertical semiconductor fin structures, often made from monocrystalline silicon. In accordance with current trends, the aspect ratio of such fin structures, meaning the height (depth) of a fin divided by the spacing between adjacent fins, may reach 20:1 or more in the coming years.

In an effort to continue scaling smaller, $4F^2$ DRAM devices have been developed. However, current $4F^2$ DRAM devices have off-leakage current issues for vertical channel transistors. The off-leakage current is caused by the floating body effect caused by hole accumulation into the body of the $4F^2$ DRAM device. With respect to these and other considerations, the present disclosure is provided.

SUMMARY OF THE DISCLOSURE

In view of the foregoing, what is needed are approaches for improved removal of the accumulated holes by laterally doping to a drain of the DRAM with high concentration. In some approaches, a method includes etching a substrate to form a plurality of trenches and a plurality of angled structures, wherein each angled structure of the plurality of angled structures includes a first sidewall opposite a second sidewall, and wherein the second sidewall extends over an adjacent trench of the plurality of trenches. The method may further include forming a spacer along a bottom surface of the trench, along the second sidewall, and along the first sidewall, wherein the spacer has an opening at a bottom portion of the first sidewall. The method may further include forming a drain in each of the plurality of angled structures by performing an ion implant to the substrate, wherein the ion implant impacts the first sidewall through the opening at the bottom portion of the first sidewall. The method may further include removing the spacer from the first sidewall, forming a bitline over the spacer along the bottom surface of each of the plurality of trenches, and forming a series of wordlines along the plurality of angled structures.

In some approaches, a dynamic random-access memory (DRAM) device may include a substrate including a plurality of trenches and a plurality of angled structures, wherein each angled structure of the plurality of angled structures includes a first sidewall opposite a second sidewall, and wherein the second sidewall extends over an adjacent trench of the plurality of trenches. The DRAM device may further include a drain in each of the plurality of angled structures, a bitline over the spacer along the bottom surface of each of the plurality of trenches, wherein the second sidewall extends over bitline, and a series of wordlines along the plurality of angled structures.

In some approaches, a method of forming a dynamic random-access memory (DRAM) device may include etching a substrate to form a plurality of trenches and a plurality of angled structures, wherein each angled structure of the plurality of angled structures includes a first sidewall opposite a second sidewall, and wherein the second sidewall extends over an adjacent trench of the plurality of trenches. The method may further include forming a spacer along a bottom surface of the trench, along the second sidewall, and along the first sidewall, wherein the spacer has an opening at a bottom portion of the first sidewall, and forming a drain in each of the plurality of angled structures by performing an ion implant to the substrate, wherein the ion implant impacts the first sidewall through the opening at the bottom portion of the first sidewall. The method may further include removing the spacer from the first sidewall, wherein the spacer remains along the bottom surface and along the second sidewall, and forming a bitline over the spacer along the bottom surface of each of the plurality of trenches, wherein the second sidewall extends over the bitline. The method may further include forming a source atop each of the plurality of angled structures by performing a second implant to the plurality of angled structures, and forming a series of wordlines along the plurality of angled structures.

Figure 1:
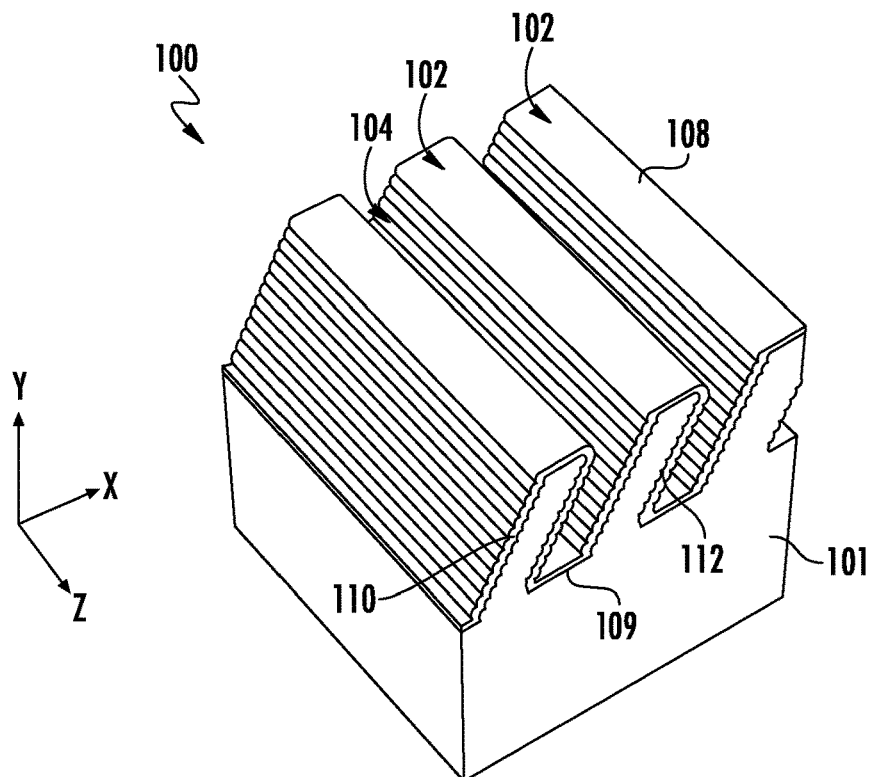
FIG. 1 is a perspective view of a device including a substrate and a plurality of angled structures in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where embodiments of the methods are shown. The methods and devices may be embodied in many different forms and are not to be construed as being limited to the embodiments set forth herein. Instead, these embodiments are provided so the disclosure will be thorough and complete, and will fully convey the scope of the system and method to those skilled in the art.

The present embodiments provide novel devices and methods for forming such devices, such as transistors, formed from semiconductor fin structures. These approaches may be especially applicable to formation of DRAM devices, while other devices may also be formed according to the embodiments of the disclosure. Various non-limiting embodiments are particularly useful for implementation where the width of fin structures or pitch between fin structures is less than 50 nm, and in some embodiments, 20 nm or less. Embodiments herein provide new integrations to effectively remove accumulated holes, which requires lateral doping to drain with high concentration.

Turning now to FIG. 1, there is shown a device 100, such as a dynamic random-access memory (DRAM) device, according to embodiments of the disclosure. The device 100 may include a plurality of angled structures 102 separated by a plurality of trenches 104. The plurality of angled structures 102 may be formed by etching a substrate 101, for example, using an angled ion etch. In exemplary embodiments, the plurality of angled structures 102 may be an array of fin structures having a length extending along a first direction (such as parallel to the z-axis of the Cartesian coordinate system shown), a height extending along a second direction (y-axis), and a width extending along a third direction (x-axis). According to various embodiments of the disclosure, the angled structures 102 are monolithically formed with the same material as the substrate 101. As will be appreciated, the device 100 may be used to make transistors and arrays of devices, such as DRAM arrays, having superior properties, including more uniformity in performance between devices, higher device yield, and so forth.

As shown in FIG. 1, the device 100 may include a first spacer layer 108 conformally formed over the substrate 101, including over all exposed surfaces of the angled structures 102 and a bottom surface 109 of each trench 104. For example, the first spacer layer 108 may be deposited over a first sidewall 110 and a second sidewall 112 of each of the angled structures 102. As will be described in greater detail herein, each angled structure 102 is slanted or tilted (e.g., along the x-axis) so the second sidewall 112 extends partially or fully over an adjacent trench 104.

Figure 2:
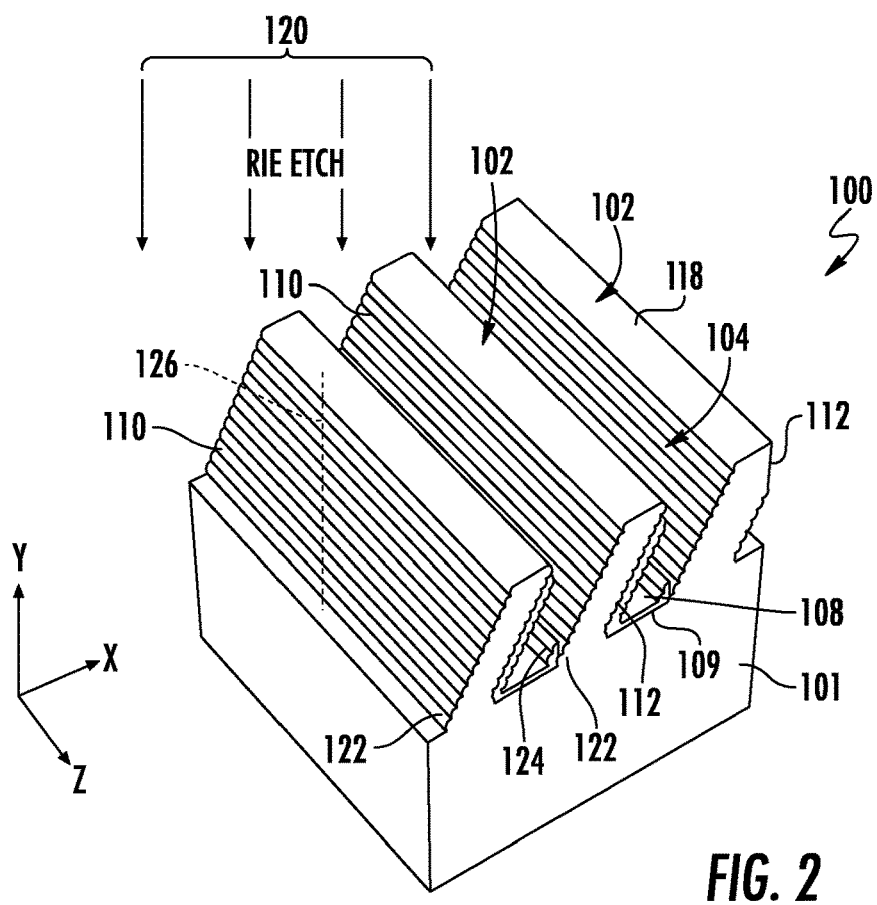
FIG. 2 is a perspective view of the device following an etch process in accordance with embodiments of the present disclosure.

Next, as shown in FIG. 2, the first spacer layer 108 may be removed from the angled structures 102, including from the first sidewall 110 and from a top surface 118 thereof. In some embodiments, the first spacer layer 108 may be etched, for example, using a vertical reactive ion etch (RIE) process 120. Due to the angle of the angled structures 102 extending over each trench 104, the first spacer layer 108 may not be removed by the vertical RIE 120 from the bottom surface 109 of each trench 104 or from a base 122 between the first sidewall 110 and the bottom surface 109. As shown, a footing 124 of the first spacer layer 108, which extends partially up the first sidewall 110, may remain in place.

It will be appreciated that the presence and/or size of the footing 124 may be influenced by the angle of the angled structures 102 and/or the angle of the RIE 120 relative to a perpendicular 126 extending normal to a plane defined by the bottom surface 109 of the trenches 104. For example, a larger/greater non-zero angle of incidence between the second sidewall 112 and the perpendicular 126 means the angled structures 102 extend farther over the trenches 104, thus preventing the vertical RIE from reaching more of the first spacer layer 108 along the trenches 104 and the first sidewalls 110. As shown, the perpendicular 126 may generally be parallel to the y-axis.

Figure 3:
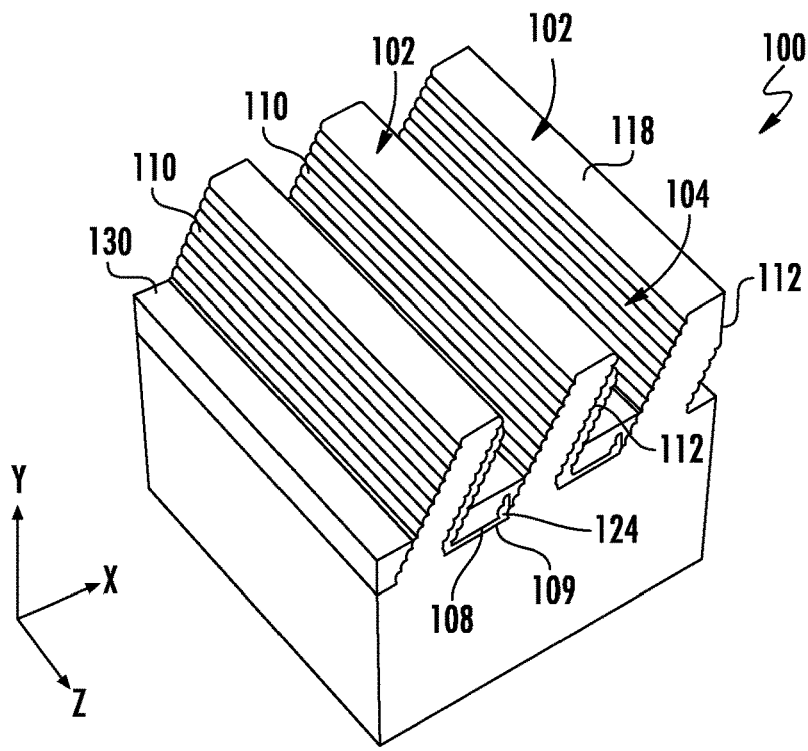
FIG. 3 is a perspective view of the device following a dielectric layer deposition and recess process in accordance with embodiments of the present disclosure.

As depicted in FIG. 3, a dielectric layer 130 may be formed over the first spacer layer 108 along the bottom surface 109 of each of the trenches 104. In some embodiments, the dielectric layer 130 may be deposited and then recessed to a desired depth/height. As shown, the dielectric layer 130 extends partially up the first and second sidewalls 110, 112 to a point above the footing 124 of the first spacer layer 108. Although non-limiting, the dielectric layer 130 may be silicon oxide, nitride, or other type of film/material.

Figure 4:
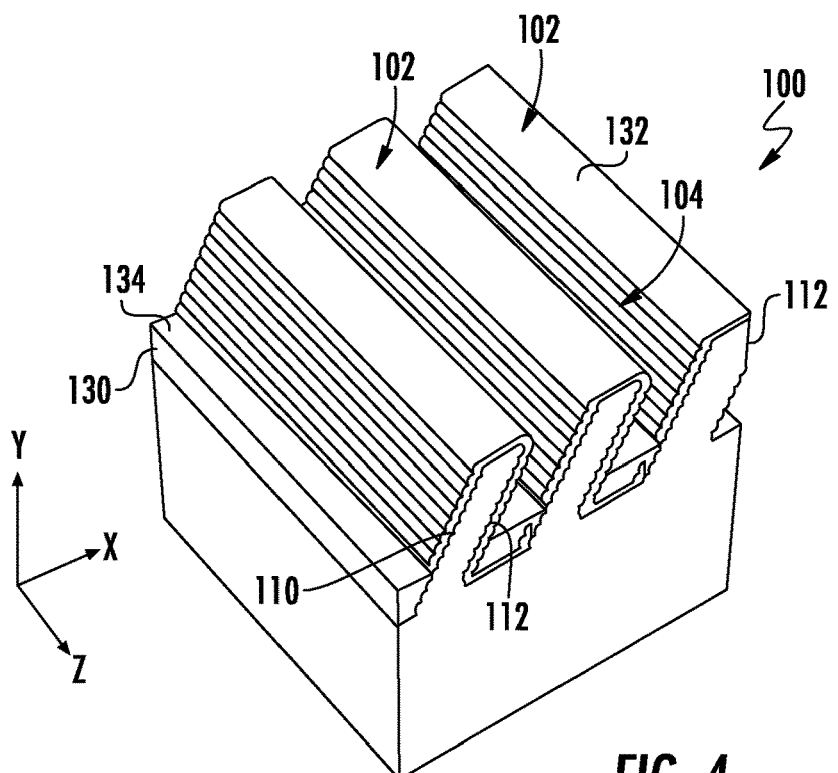
FIG. 4 is a perspective view of the device following removal of a portion of a spacer in accordance with embodiments of the present disclosure.
Figure 5:
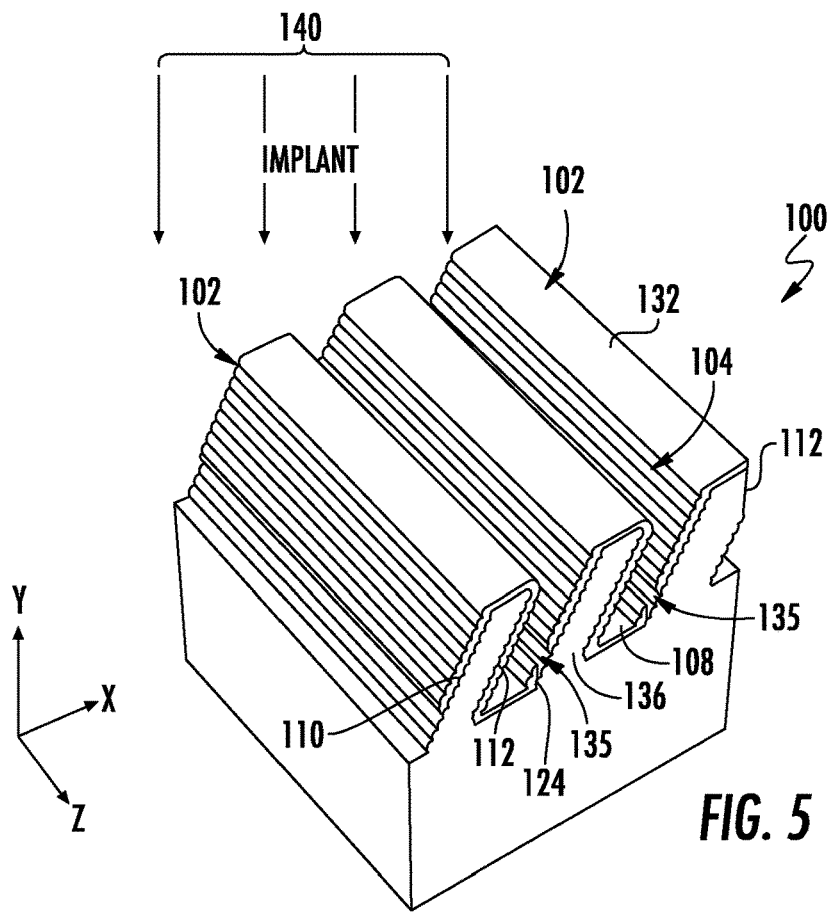
FIG. 5 is a perspective view of the device during an ion implant in accordance with embodiments of the present disclosure.
Figure 6:
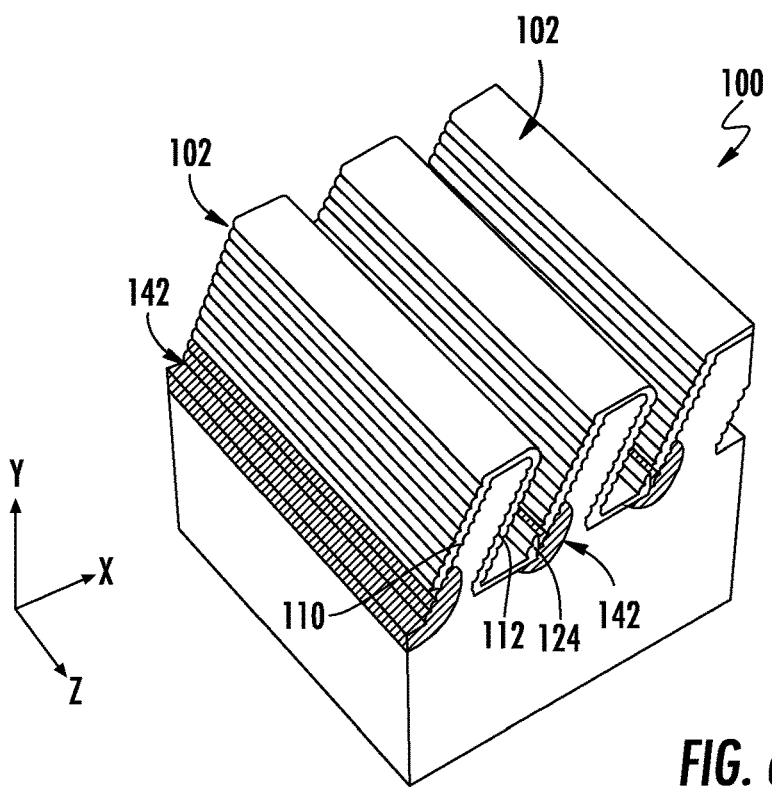
FIG. 6 is a perspective view of the device after formation of a plurality of drains in accordance with embodiments of the present disclosure.

As shown in FIG. 4, a second spacer layer 132 may then be formed over the angled structures 102. The second spacer layer 132 may extend along the first and second sidewalls 110, 112 to a top surface 134 of the dielectric layer 130. Once the dielectric layer 130 is removed, as demonstrated in FIG. 5, an opening 135 at a bottom portion 136 of each first sidewall 110 may be present. The opening 135 may separate the footing 124 of the first spacer layer 108 from the second spacer layer 132. A subsequent ion implant 140 to the device 100 will impact the first sidewalls 110 through each opening 135, resulting in a drain 142 being formed in each angled structure 102, as shown in FIG. 6. The ion implant 140 may be an epi plasma doping (PLAD) or beamline implant.

Although shown as a single implant, it will be appreciated that the ion implant 140 may include a series of multiple implants. For example, in some non-limiting embodiments, the ion implant 140 may first include a deep phosphorous implant to isolate Pwell followed by boron implant for the Pwell, e.g., for array access devices. A voltage for the boron implant may then be raised to reduce row hammer, which is an issue seen in DRAM devices due to frequent turning on or off of adjacent cells, followed by a source/drain (S/D) P implant and a S/D As implant. Next, a Ge implant into poly silicon may be performed to form a storage node contact, while also reducing interface resistance by amorphization. A blanket P implant for NMOS may then be performed, wherein PMOS may be counter doped at a later stage. Finally, the device 100 may be heated, for example, by a 1000 C rapid thermal anneal (RTA). In some non-limiting embodiments, the RTA may be performed for approximately 10 seconds in 1% O2 to activate dopants.

Figure 7:
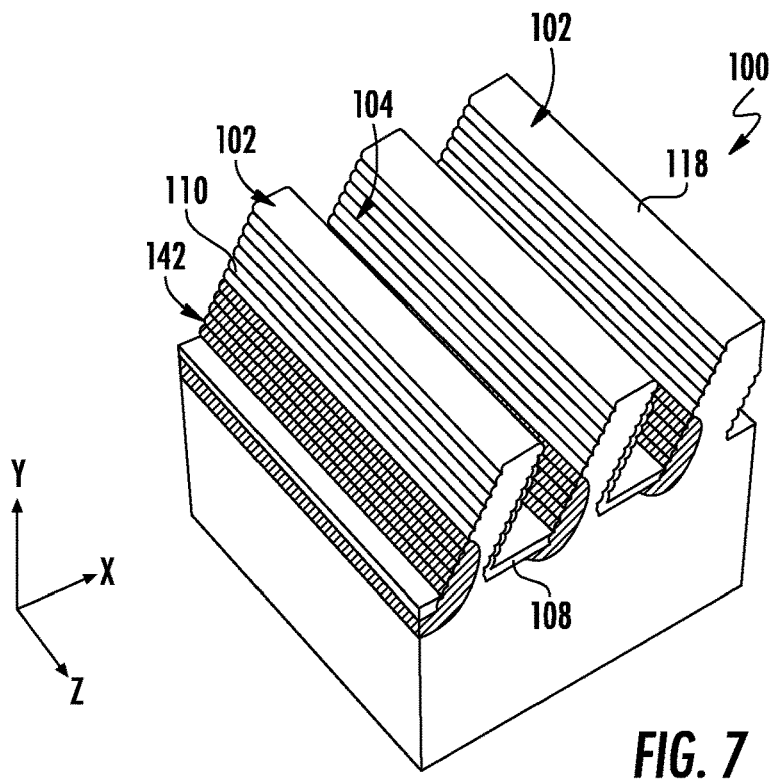
FIG. 7 is a perspective view of the device after removal of the spacer in accordance with embodiments of the present disclosure.
Figure 8:
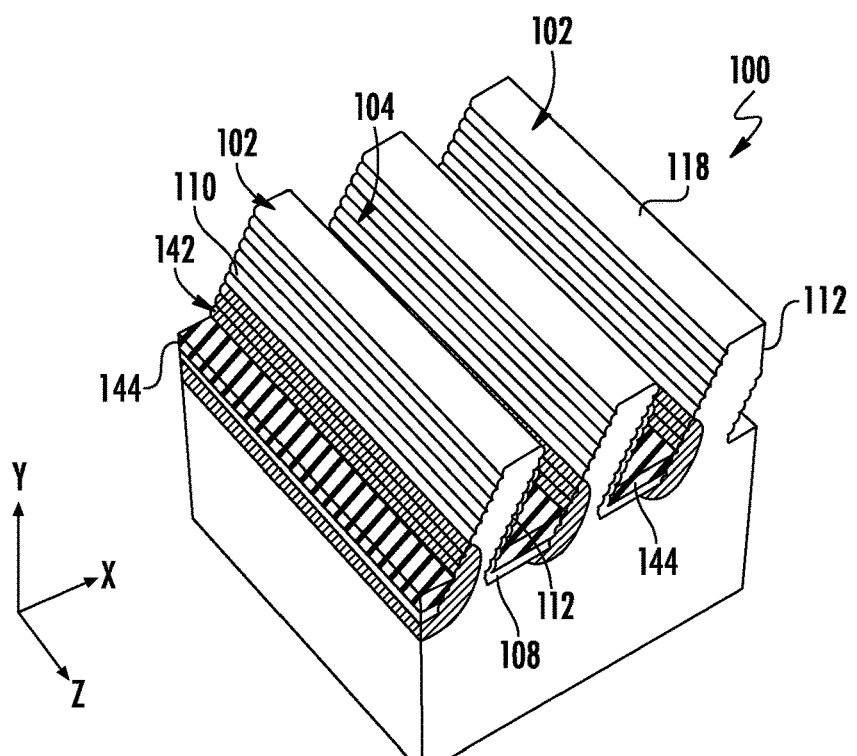
FIG. 8 is a perspective view of the device after a bitline deposition and recess process in accordance with embodiments of the present disclosure.

Next, as shown in FIG. 7, the second spacer layer 132 may then be removed from the first sidewalls 110 and from the top surfaces 118 of each angled structure 102. In some embodiments, the first spacer layer 108 may remain atop the bottom surface 109 of each trench 104. The footing 124 of the first spacer layer 108 may be removed, however. As shown in FIG. 8, a bitline 144 may be formed over the first spacer layer 108 within each trench 104. In some embodiments, the bitline 144 may be a low resistance material, such as tungsten, titanium nitride, titanium, Ruthenium, Cobalt Molybdenum etc., which is deposited over the device 100 and recessed to a desired thickness/height within the trenches 104. As shown, the bitline 144 may extend partially up the first and second sidewalls 110, 112. However, a portion of each drain 142 may remain uncovered by the bitline 144 in some embodiments. Furthermore, a portion of the first spacer layer 108 remains exposed along the second sidewalls 112.

Figure 9:
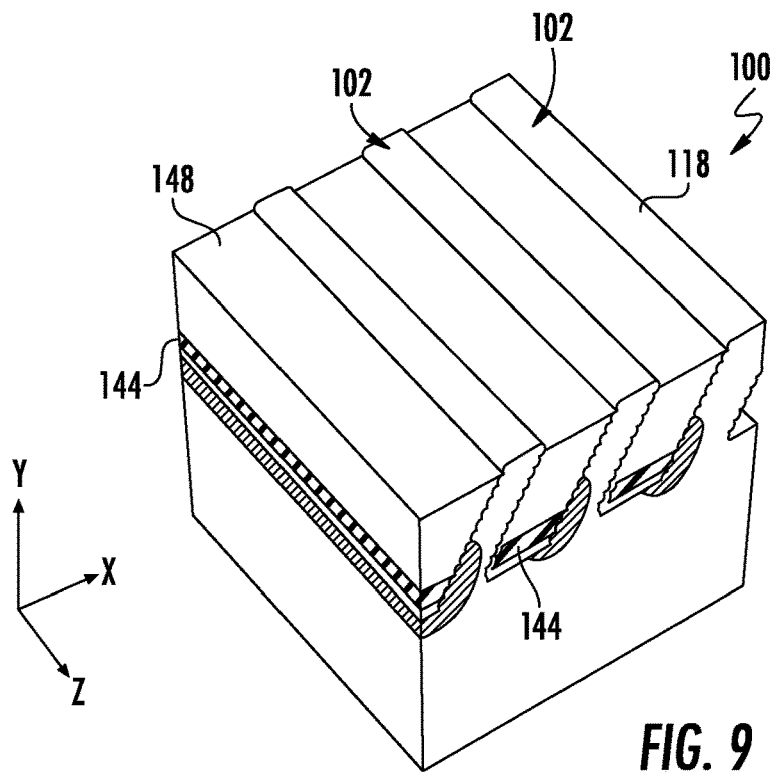
FIG. 9 is a perspective view of the device after a dielectric fill and planarization process in accordance with embodiments of the present disclosure.
Figure 10:
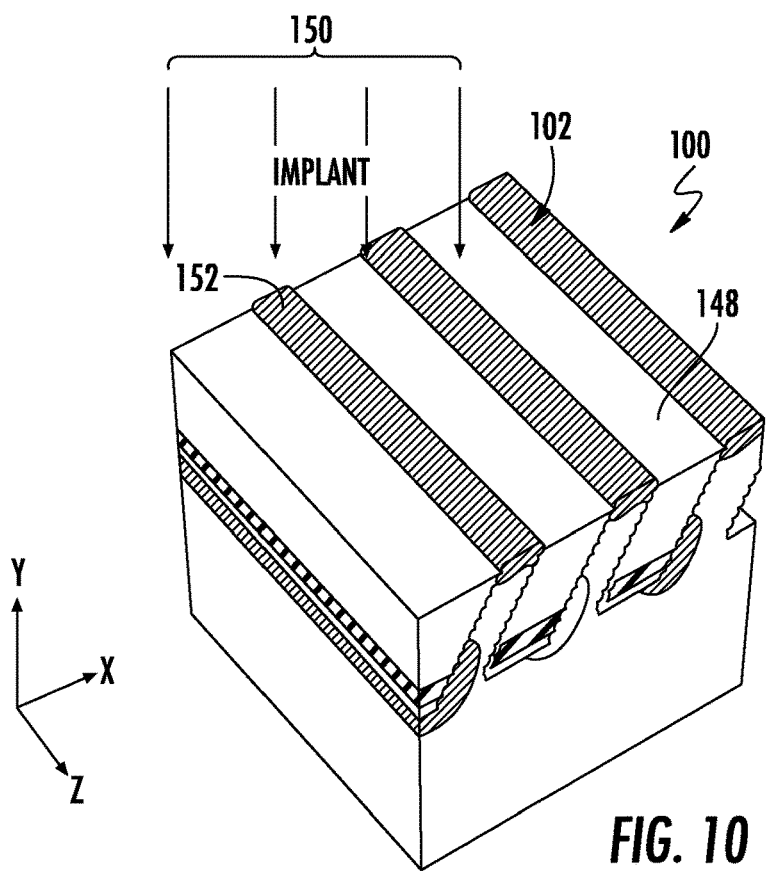
FIG. 10 is a perspective view of the device during a second ion implant in accordance with embodiments of the present disclosure.

As shown in FIG. 9, a first dielectric 148 may be deposited over the device 100, including over the bitline 144 within each of the trenches 104 (FIG. 8). The first dielectric 148 may then be planarized to a desired height, for example, planar or substantially planar with the top surface 118 of the angled structures 102. A second ion implant 150 may then be performed to form a source layer 152 atop each of the angled structures 102, as shown in FIG. 10. In some embodiments, the second ion implant 150 may be a low-dose source/drain Phosphorous or Arsenic implant.

Figure 11:
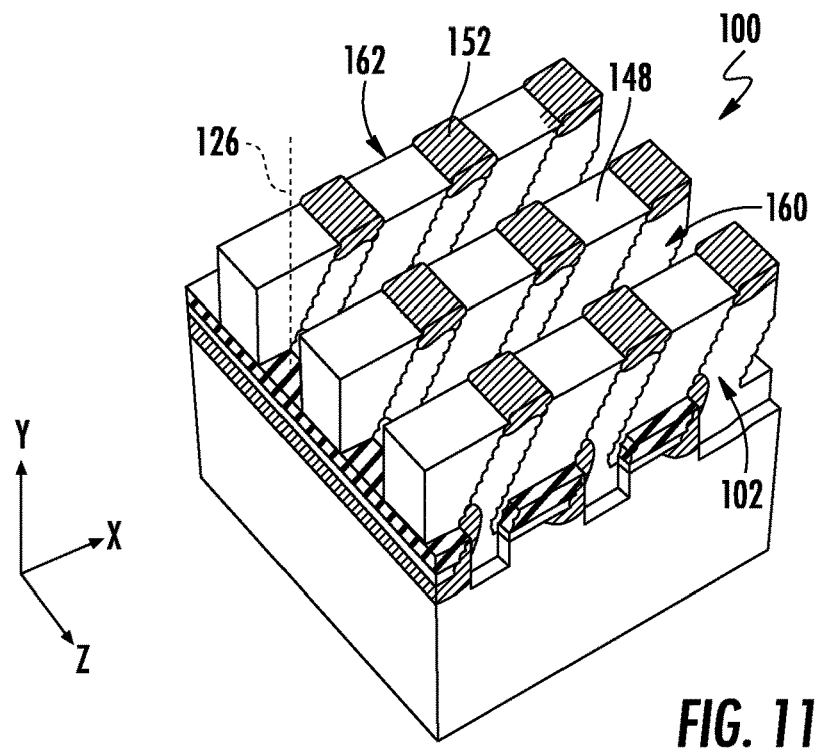
FIG. 11 is a perspective view of the device after formation of a plurality of vertical structures and a second plurality of trenches in accordance with embodiments of the present disclosure.

As shown in FIG. 11, the first dielectric 148, the source layer 152, and the angled structures 102 may be etched to form a second plurality of trenches 160 and a plurality of vertical structures 162. In exemplary embodiments, the angled structures 102 and the plurality of vertical structures 162 extend perpendicular to one another. For example, the plurality of vertical structures 162 may generally extend parallel to the x-axis, while the plurality of angled structures 102 may generally extend parallel to the z-axis. In some embodiments, the plurality of vertical structures 162 may generally extend parallel to the perpendicular 126.

Figure 12:
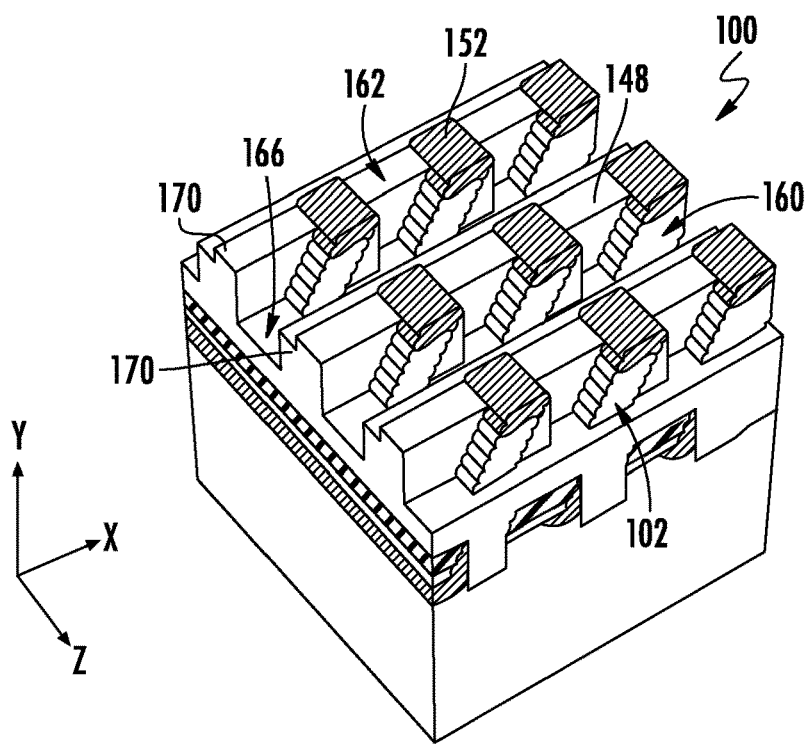
FIG. 12 is a perspective view of the device after a dielectric fill and lithography patterning and etch process to open a side of the wordline in accordance with embodiments of the present disclosure.
Figure 13:
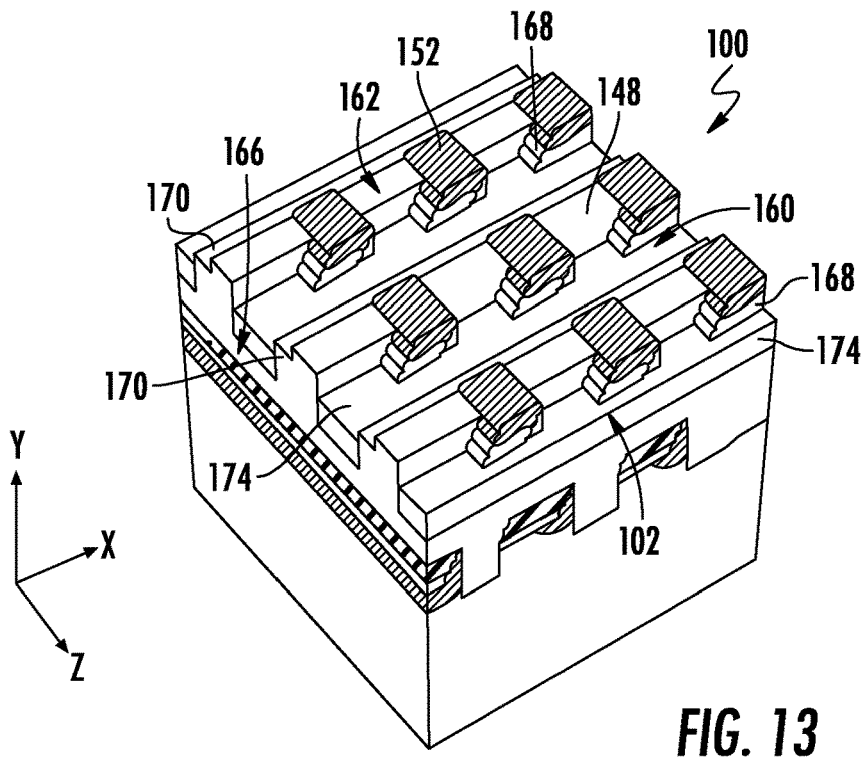
FIG. 13 is a perspective view of the device after a wordline metal deposition and recess process in accordance with embodiments of the present disclosure.

Next, as shown in FIG. 12, a second dielectric 166 may be deposited over the device 100, for example, using a dielectric fill and lithography patterning and etch process within the second plurality of trenches 160. The second dielectric 166 may be partially removed to expose the angled structures 102, which are subsequently covered with a gate dielectric 168 (FIG. 13). In some embodiments, the gate dielectric 168 may be formed by a deposition and etch back process. Partially removing the second dielectric 166 may include recessing the second dielectric 166 within the second plurality of trenches 160 and recessing a portion of the second dielectric 166 of the plurality of vertical structures 162 to form a stepped sidewall 170. The stepped sidewall 170 may beneficially expose a side of the tilted angled structures 102 to form a partially wrapped gate to provide better transistor control.

Next, as shown in FIG. 13, a metal may be deposited over the second dielectric 166 and the gate dielectric 168 to form a series of wordlines 174. In some embodiments, the metal of the wordline 174 may be a low-resistance material, such as tungsten, titanium nitride, titanium, ruthenium, cobalt molybdenum, etc. The metal of the wordlines 174 may be deposited and then removed (e.g., etched) to a desired height/thickness. As shown, the wordlines 174 may extend partially up the plurality of vertical structures 162 and partially up the angled structures 102. Furthermore, the wordlines 174 may run parallel to the plurality of vertical structures 162 and perpendicular to the trenches 104 (not shown).

Figure 14:
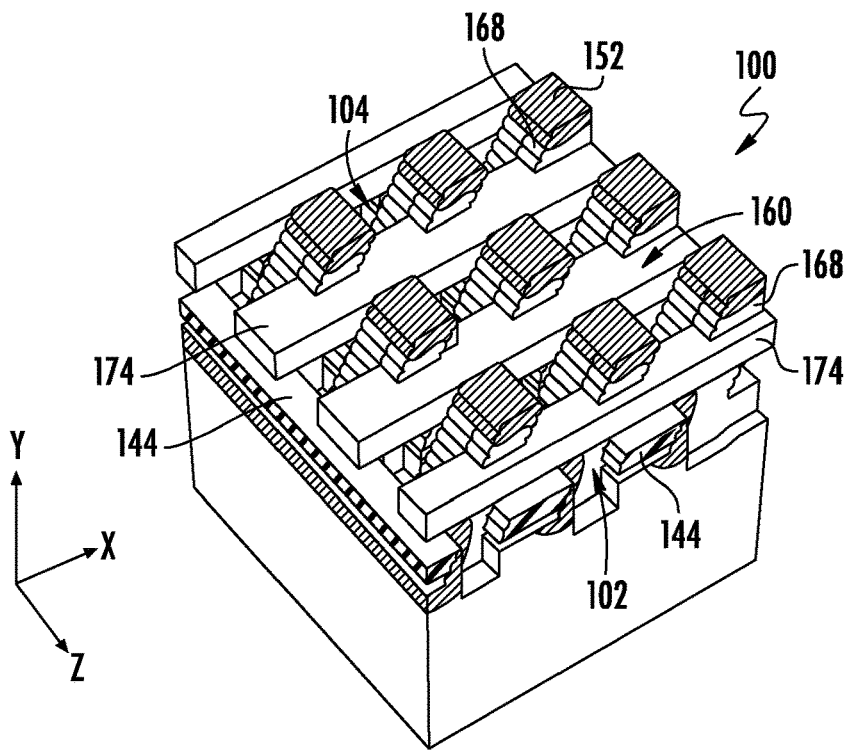
FIG. 14 is a perspective view of the device after dielectric removal in accordance with embodiments of the present disclosure.

Next, as shown in FIG. 14, the second dielectric 166 and a portion of the gate dielectric 168 may be removed from the device 100 following formation of the wordlines 174. Once complete, the device 100 may be an improved $4F^2$ DRAM device having bitlines 144 tucked under the tilted angled structures 102. As shown, the wordlines 174 may run perpendicular to the trenches 104.

Figure 15:
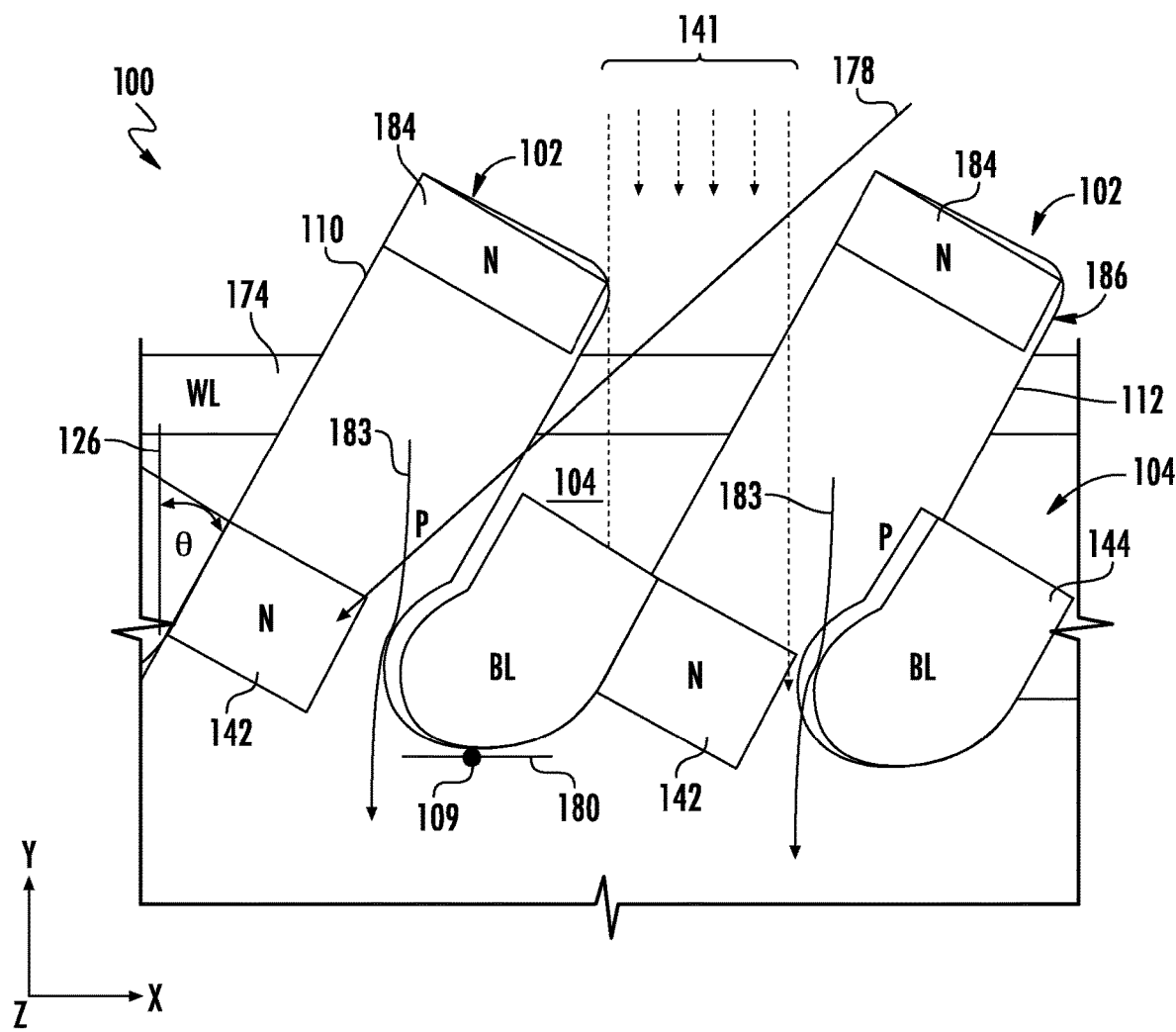
FIG. 15 is a side cross-sectional view of the device in accordance with embodiments of the present disclosure.

Turning now to FIG. 15, a side cross-sectional view of the device 100 according to embodiments of the present disclosure will be described in greater detail. Although not shown, it will be appreciated that spacer films may be present on the device 100. As shown, the device 100 may include the plurality of trenches 104 and the plurality of angled structures 102, wherein each angled structure of the plurality of angled structures 102 includes the first sidewall 110 opposite the second sidewall 112. Due to the angle and thickness (e.g., along the x-axis) of the plurality of angled structures 102, each second sidewall 112 may extend over an adjacent trench 104. As shown, each bitline 144 may be tucked under the angled structures 102, while the drains 142 can be doped by a vertical implant 141 and/or a line of sight angled implant 178. As further shown, a phosphorous implant 183 may be performed before or after fin etching to form wells in the device 100.

The angled structures 102 of the device 100 may be oriented at a non-zero angle of incidence ($\theta$) with respect to the perpendicular 126 extending normal to a plane 180 defined by the bottom surface 109 of the trenches 104. As further shown, each of the plurality of angled structures 102 includes a source 184 formed in a top portion 186 thereof, wherein wordline(s) 174 extend across the angled structures 102, for example, along the x-axis.

In view of the foregoing, at least the following advantages are achieved by the embodiments disclosed herein. A first advantage is the elimination or reduction in hole accumulation into the body of the device due to the floating body effect, by providing a path for the holes. A second advantage is the reduction of off-leakage current, e.g., for vertical channel transistors.

In various embodiments, design tools can be provided and configured to create the datasets used to pattern the semiconductor layers of devices 100 and 200, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of substrates, the semiconductor substrate employed in the present embodiments may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RT-CVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   etching a substrate to form a plurality of trenches and a plurality of angled structures, wherein each angled structure of the plurality of angled structures includes a first sidewall opposite a second sidewall, and wherein the second sidewall extends over an adjacent trench of the plurality of trenches;
   forming a spacer along a bottom surface of the plurality of trenches, along the second sidewall, and along the first sidewall, wherein the spacer has an opening at a bottom portion of the first sidewall;
   forming a drain in each of the plurality of angled structures by performing an ion implant to the substrate, wherein the ion implant impacts the first sidewall through the opening at the bottom portion of the first sidewall;

removing the spacer from the first sidewall;
forming a bitline over the spacer along the bottom surface of each of the plurality of trenches; and
forming a series of wordlines along the plurality of angled structures.

2. The method of claim 1, further comprising:
forming a dielectric over the bitline within each trench;
performing a second ion implant to form a source atop each of the plurality of angled structures; and
etching the dielectric and the plurality of angled structures to form a second plurality of trenches and a plurality of structures, wherein the plurality of trenches and the second plurality of trenches extend in different directions.

3. The method of claim 2, further comprising:
forming a second dielectric within the second plurality of trenches;
partially removing the second dielectric to expose the plurality of angled structures;
forming a gate dielectric along the plurality of angled structures; and
depositing a wordline metal over the second dielectric and the gate dielectric.

4. The method of claim 3, further comprising removing the second dielectric and a portion of the gate dielectric after deposition of the wordline metal.

5. The method according claim 3, wherein partially removing the second dielectric comprises recessing the second dielectric within the second plurality of trenches and recessing a portion of the second dielectric of the plurality of structures.

6. The method of claim 1, wherein performing the ion implant to the substrate comprises implanting the substrate at a non-zero angle of incidence with respect to a perpendicular extending from a plane defined by the bottom surface of each of the plurality of trenches.

7. The method according to claim 1, further comprising forming a dielectric layer over the bottom surface of each of the plurality of trenches, wherein the spacer is formed over the first and second sidewalls following formation of the dielectric layer.

8. The method according to claim 7, forming the spacer comprising:
conformally forming a spacer layer over the bottom surface of each of the plurality of trenches, the second sidewalls, and the first sidewalls;
etching the spacer layer to remove the spacer layer from the first sidewalls, wherein the spacer layer remains along the bottom surface of each of the plurality of trenches and along the second sidewalls;
forming the dielectric layer over the bottom surface of each of the plurality of trenches, wherein the dielectric layer extends partially up the first sidewalls; and
forming a second spacer layer over the first sidewalls and the second sidewalls.

9. The method according to claim 8, further comprising removing the dielectric layer to form the opening at the bottom portion of the first sidewall.

10. A method of forming a dynamic random-access memory (DRAM) device, comprising:
etching a substrate to form a plurality of trenches and a plurality of angled structures, wherein each angled structure of the plurality of angled structures includes a first sidewall opposite a second sidewall, and wherein the second sidewall extends over an adjacent trench of the plurality of trenches;
forming a spacer along a bottom surface of each of the plurality of trenches and along the first and second sidewalls of each of the plurality of angled structures, wherein the spacer has an opening at a bottom portion of the first sidewalls;
forming a drain in each of the plurality of angled structures by performing an ion implant to the substrate, wherein the ion implant impacts the first sidewalls through the opening at the bottom portion of the first sidewalls;
removing the spacer from the first sidewalls, wherein the spacer remains along the bottom surface of each of the plurality of trenches and along the second sidewalls;
forming a bitline over the spacer along the bottom surface of each of the plurality of trenches, wherein the second sidewalls extend over the bitlines;
forming a source atop each of the plurality of angled structures by performing a second implant to the plurality of angled structures; and
forming a series of wordlines along the plurality of angled structures.

11. The method of claim 10, further comprising:
forming a dielectric over the bitline within each trench of the plurality of trenches;
performing a second ion implant to the dielectric and to the plurality of angled structures to form the source atop each of the plurality of angled structures; and
etching the dielectric and the plurality of angled structures to form a second plurality of trenches and a plurality of vertical structures, wherein the plurality of trenches and the second plurality of trenches extend perpendicular to one another.

12. The method of claim 11, further comprising:
forming a second dielectric within the second plurality of trenches;
partially removing the second dielectric to expose the plurality of angled structures;
forming a gate dielectric along the plurality of angled structures;
depositing a wordline metal over the second dielectric and the gate dielectric; and
removing the second dielectric and a portion of the gate dielectric after deposition of the wordline metal.

13. The method according to claim 10, further comprising forming a dielectric layer over the bottom surface of each of the plurality of trenches, wherein the spacer is formed over the first and second sidewalls of the plurality of angled structures following formation of the dielectric layer.

14. The method according to claim 13, forming the spacer comprising:
conformally forming a spacer layer over the bottom surface of each of the plurality of trenches and along the first and second sidewalls of each of the plurality of angled structures;
etching the spacer layer to remove the spacer layer from the first sidewalls, wherein the spacer layer remains along the bottom surface of each of the plurality of trenches and along the second sidewalls;
forming the dielectric layer over the bottom surface of each of the plurality of trenches, wherein the dielectric layer extends partially up the first sidewalls; and
forming a second spacer layer over the first sidewalls and the second sidewalls.

15. The method according to claim 14, further comprising removing the dielectric layer to form the opening at the bottom portion of the first sidewall.

* * * * *